United States Patent
Carey et al.

(10) Patent No.: US 10,595,437 B2
(45) Date of Patent: Mar. 17, 2020

(54) INFORMATION HANDLING SYSTEM WITH MODULAR FAN GANTRY HAVING DIFFERENT MOUNTING VARIATIONS

(71) Applicant: DELL PRODUCTS, LP, Round Rock, TX (US)

(72) Inventors: Daniel J. Carey, Austin, TX (US); Jean Doglio, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 40 days.

(21) Appl. No.: 16/047,995

(22) Filed: Jul. 27, 2018

(65) Prior Publication Data
US 2020/0037466 A1    Jan. 30, 2020

(51) Int. Cl.
*H05K 7/20* (2006.01)
*H05K 7/14* (2006.01)

(52) U.S. Cl.
CPC ....... *H05K 7/20172* (2013.01); *H05K 7/1401* (2013.01); *H05K 7/1487* (2013.01); *H05K 7/1489* (2013.01)

(58) Field of Classification Search
CPC .. H05K 7/1489; H05K 7/1401; H05K 5/0221; H05K 5/0217; H05K 7/1487; H05K 7/20172
See application file for complete search history.

(56) References Cited

U.S. PATENT DOCUMENTS

| | | | | |
|---|---|---|---|---|
| 6,115,250 A * | 9/2000 | Schmitt | .............. | H05K 7/20727 |
| | | | | 165/104.34 |
| 7,623,344 B2 | 11/2009 | Beall et al. | | |
| 8,182,319 B2 * | 5/2012 | Ong | .......... | G06F 1/20 |
| | | | | 361/679.48 |
| 8,567,746 B2 * | 10/2013 | Li | .......... | G06F 1/183 |
| | | | | 248/220.22 |
| 2012/0026678 A1 | 2/2012 | Rodriguez et al. | | |

* cited by examiner

*Primary Examiner* — Jinhee J Lee
*Assistant Examiner* — Ingrid D Wright
(74) *Attorney, Agent, or Firm* — Larson Newman, LLP

(57) ABSTRACT

An information handling system includes a server chassis and a fan gantry. The server chassis has a first bracket secured to a first edge of the server chassis, a second bracket secured to a second edge of the server chassis, and a center mount secured to a bottom of the server chassis. The fan gantry has multiple fans, a first block secured to a first end of the fan gantry, a second block secured to a second end of the fan gantry, and an opening in a center of a bottom surface of the fan gantry. The first block interfaces with the first bracket, the second block interfaces with the second bracket, and the center mount inserts within the opening to mount the fan gantry to the server chassis.

19 Claims, 7 Drawing Sheets

INFORMATION HANDLING SYSTEM WITH MODULAR FAN GANTRY HAVING DIFFERENT MOUNTING VARIATIONS

FIELD OF THE DISCLOSURE

The present disclosure generally relates to information handling systems, and more particularly relates to an information handling system with a modular fan gantry having different mounting variations.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes a server chassis and a fan gantry. The server chassis has a first bracket secured to a first edge of the server chassis, a second bracket secured to a second edge of the server chassis, and a center mount secured to a bottom of the server chassis. The fan gantry has multiple fans, a first block secured to a first end of the fan gantry, a second block secured to a second end of the fan gantry, and an opening in a center of a bottom surface of the fan gantry. The first block may interface with the first bracket, the second block may interface with the second bracket, and the center mount may insert within the opening to mount the fan gantry to the server chassis.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
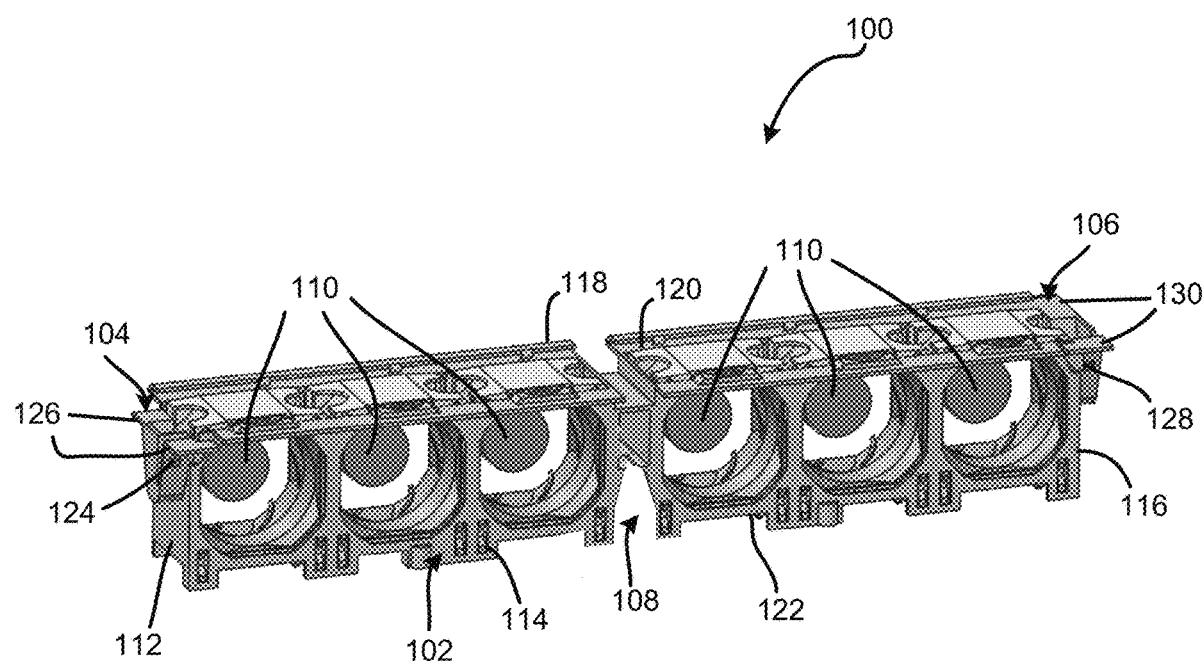
FIG. 1 is a perspective view of a fan gantry for an information handling system according to at least one embodiment of the disclosure.

FIG. 1 shows a fan gantry 100 for an information handling system 100 according to at least one embodiment of the disclosure. For purpose of this disclosure information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 500 can be a personal computer, a laptop computer, a smart phone, a tablet device or other consumer electronic device, a network server, a network storage device, a switch, a router, or another network communication device, or any other suitable device and may vary in size, shape, performance, functionality, and price.

The fan gantry 100 includes a main portion 102, blocks 104 and 106, and an opening 108. In an embodiment, the fan gantry 100 is supports multiple fans 110. In the exemplary fan gantry 100, six fans 110 have been shown. However, the number fans 110 can vary depending in different embodiments of the fan gantry. In an embodiment, the fans 110 are utilized to cool components within a server chassis or other information handling system. The fan gantry 100 further includes side surfaces 112, 114, 116, and 118, a top surface 120, and a bottom surface 122. In an embodiment, the fan 110 can be inserted and removed from the fan gantry 100 via the top surface 120. In an embodiment, block 104 is connected to the side surface 112, and block 106 is connected to the side surface 116. In an embodiment, air flow through the fans 110 of the fan gantry 100 can flow from surface 114 to surface 118, or from surface 118 to surface 114.

The opening 108 can be located along any portion of the bottom surface 122, such as substantially in the center as shown in FIG. 1. In an embodiment, the opening 108 can be wedge shaped, such that the opening is a first width at the bottom surface 122 and tapers to a second width toward the top surface 120. In an embodiment, the blocks 104 and 106 can be wedge shaped, such that the blocks 104 and 106 are first width near the top surface 120 of the fan gantry 100, and taper to a second width toward the bottom surface 122. In an embodiment, the first width is wider than the second width for both of the blocks 104 and 106. The block 104 includes one or more latches 124 and finger holds 126. The block 106 includes one or more latches 128 and finger holds 130. In different embodiments, the latches 124 and 126 can be any shape, size, location on the blocks 104 and 106, and the like, without varying from the scope of this disclosure. A user can utilize to finger holds 126 and 130 while placing the fan gantry 100 within a server chassis 200 as described below with respect to FIGS. 2-7 below.

Figure 2:
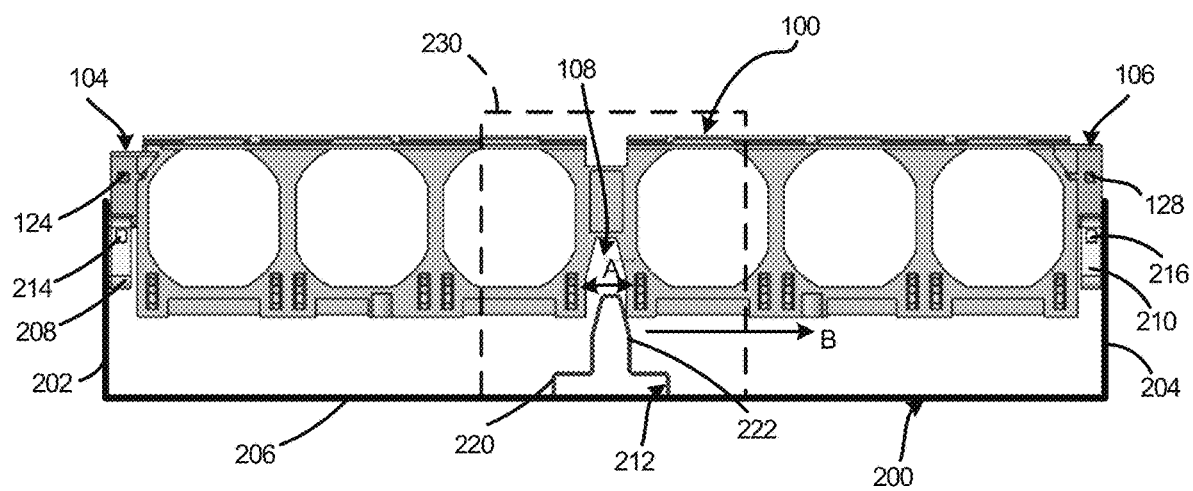
FIGS. 2-7 are diagrams of the fan gantry at a server chassis according to at least one embodiment of the present disclosure

FIG. 2 illustrates a cross section of a portion of server chassis 200, and the fan gantry 100. The server chassis includes sides 202 and 204, and a bottom 206. The server chassis 200 also includes brackets 208 and 210, and a center mount 212. In different embodiments, the center mount 212 can be mounted in different locations along the bottom 206, such as substantially in the center as shown in FIG. 2, without varying from the scope of this disclosure. The bracket 208 is mounted on the side 202, and the bracket 210 is mounted on the side 204. In an embodiment, the bracket 208 includes a hole 214 or other component to interface with the latch 124 of the block 104 of the fan gantry 100. In an embodiment, the bracket 210 includes a hole 216 or other component to interface with the latch 128 of the block 106 of the fan gantry 100.

The center mount 212 includes a base portion 220 and a protruding portion 222. The protruding portion 222 preferably extends from base portion 220, such that the protruding portion 222 can interface with the opening 108 of the fan gantry 100. In an embodiment, the protruding portion 222 can be wedge shaped, such that the protruding portion 222 is a first width at the base portion 220 and tapers to a second width as the protruding portion 222 extends away from the base portion 220. During installation of the fan gantry 100 into the server chassis 200, the opening 108 can interface with the protruding portion 222 of the center mount to provide rough and fine side-to-side alignment, as shown by arrow A in FIG. 2, of the fan gantry 100 within the server chassis 200. As the fan gantry 100 is lowered into the server chassis 200, an edge of the opening 108 can be placed in contact with a surface of the protruding portion 222 of the center mount 212, as shown in FIG. 2.

In response to the protruding portion 222 contacting an edge of the opening 108, the fan gantry 100 can move toward side 202 or 204 of the server chassis 200 depending of a side of the protruding portion 222 that contacted an edge of the opening 108. For example, if an edge of the opening 108 contacts the side of the protruding portion 222 shown in FIG. 2, the fan gantry 100 slides, in the direction of arrow B, toward side 204 of the server chassis 200. As the fan gantry 100 is inserted further into the server chassis 200, rough side-to-side alignment of the fan gantry 100 can be accomplished via contact between the tapered portion of the protruding portion 222 and a portion of the opening that does not vary in width.

Figure 3:
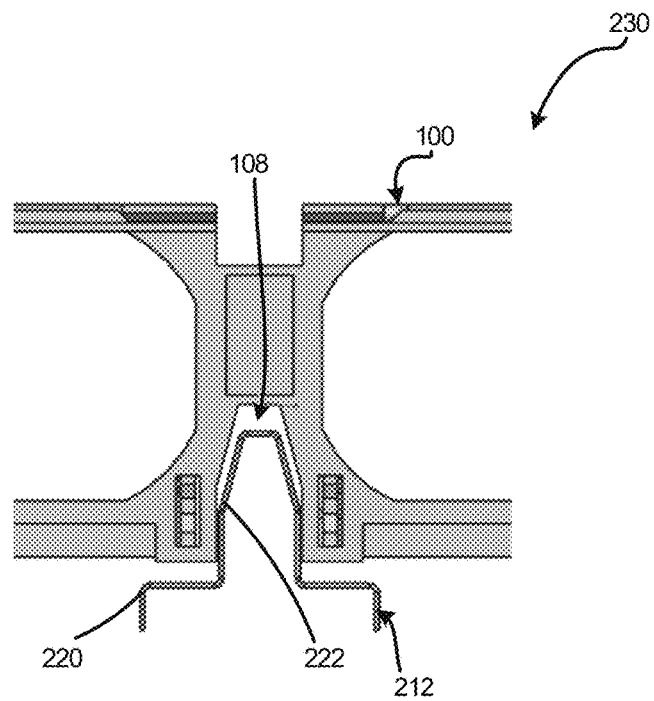
Figure 4:
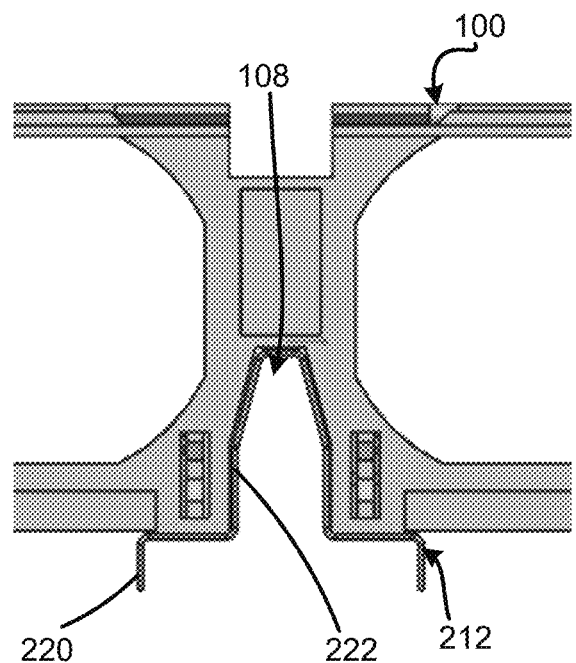

FIG. 3 shows the fine side-to-side alignment of the fan gantry 100. FIG. 3 illustrates a portion 230 of the fan gantry 100 and server chassis 200 according to at least one embodiment of the present disclosure. As the protruding portion 222 is inserted further within the opening 108, the fit of the center mount 212 and the opening 108 becomes tighter, such that any side-to-side adjustments of the fan gantry 100 become fine corrections. Thus, by the time the protruding portion 222 of the center mount 212 is fully inserted within the opening 108, as shown in FIG. 4, the side-to-side adjustments of the fan gantry 100 are completed. In an embodiment, the center mount 212 is not a solid component so as to enable cables to be routed through the main portion 220 and/or the protruding portion 222 from one part of the server chassis 200 to another. In another embodiment, the fan gantry 100 can include multiple snap features that interface with guide pins on a motherboard of the server chassis 200. In this embodiment, the interface between the snap features and the guide pins can provide side-to-side alignment in a similar manner as the opening 108 and the center mount 212. Thus, the snap features and the guide pins can replace the opening 108 and the center mount 212 in the fan gantry 100 and server chassis 200.

Figure 5:
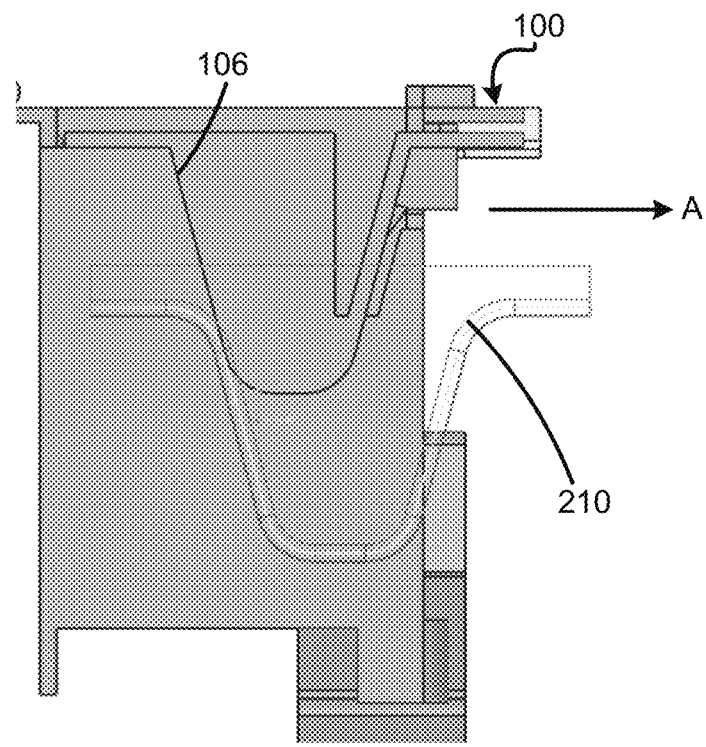
Figure 6:
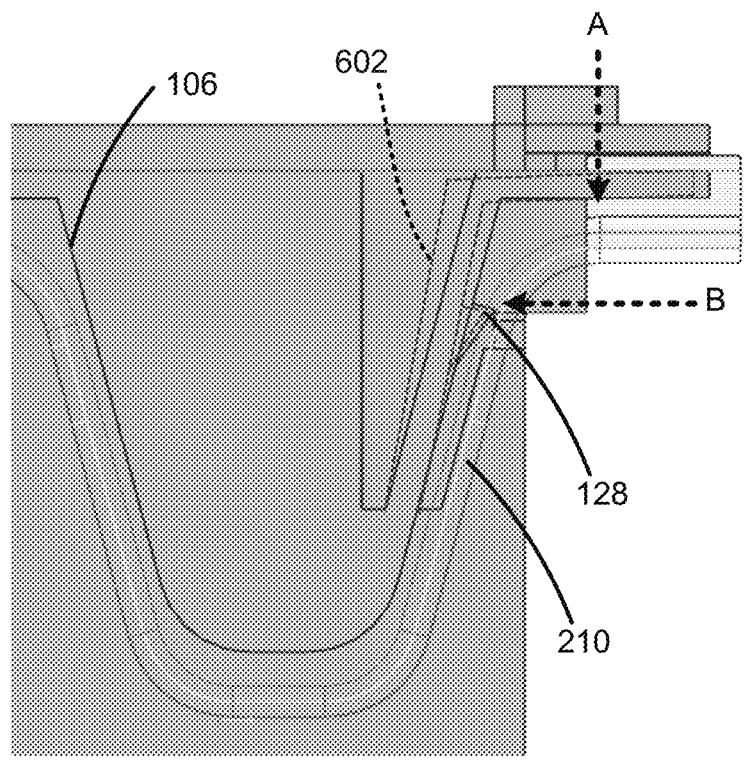
Figure 7:
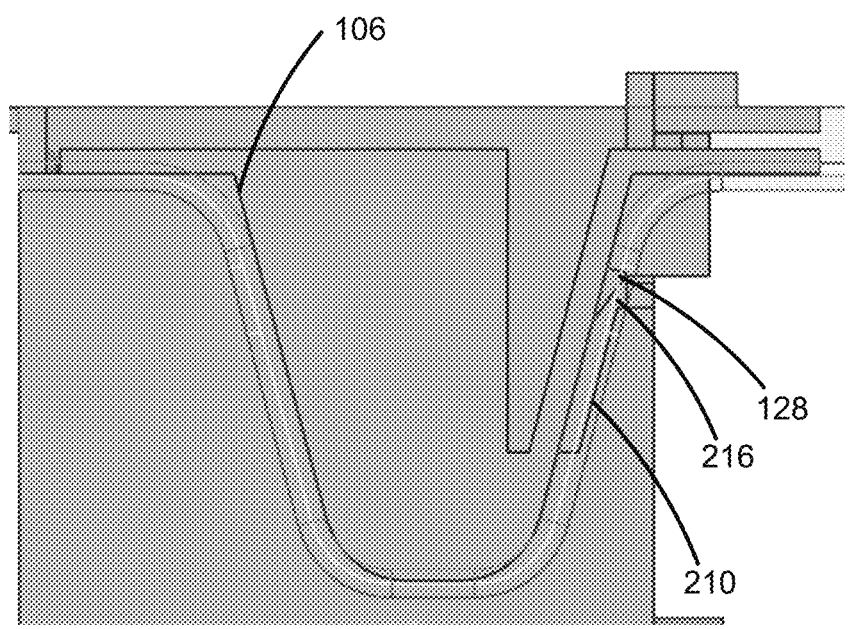

Referring back to FIG. 2, block 104 can interface with bracket 208 and block 106 can interface with bracket 210 to provide rough and fine front-to-back alignment of the fan gantry 100 within the server chassis 200. For brevity and clarity, the front-to-back alignment of the fan gantry 100 will be described only with respect to block 106 and bracket 210 as shown in FIGS. 5-7. However, one of ordinary skill in the art would recognize that the front-to-back alignment of the fan gantry 100 is also guided by the block 104 and bracket 208 in substantially the same manner as respect to the block 106 and bracket 210 as described below.

FIG. 5 shows how as the fan gantry 100 is lowered into the server chassis, an edge of the block 106 can be placed in contact with a surface of the bracket 210. In response to the block 106 contacting an edge of the bracket 210, the fan gantry 100 can move toward the front or back of the server chassis 200 depending of a side of the block 106 that contacted an edge of the bracket 210. For example, if an edge of the block 106 contacts the side of the bracket 210 shown in FIG. 5, the fan gantry 100 slides, in the direction of arrow A. As the fan gantry 100 is inserted further into the server chassis 200, rough front-to-back alignment of the fan gantry 100 can be accomplished via contact between the tapered portion of the block 106 and the tapered portion of the bracket 210.

Referring now to FIG. 6, fine front-to-back alignment of the fan gantry 100 will be described. As the block 106 is inserted further within the bracket 210, the fit between the block 106 and the bracket 210 becomes tighter, such that any front-to-back adjustments of the fan gantry 100 become fine corrections. Additionally, as the fan gantry 100 is continually press down into the server chassis 200, as shown by arrow A in FIG. 6, the latch 128 is placed in physical contact with an edge of the bracket 210, such that a portion 602 of the block 106 flexes away from the edge of the bracket 210 in the direction of arrow B. In an embodiment, prior to the user pressing down on the fan gantry 100 to flex the block 106 away from the bracket 210, the fan gantry 100 can rest in a staged position within the server chassis 100. Then as the fan gantry 100 is pressed further into the server chassis 100, the latch 128 is pushed beyond an edge of the hole 216 in the bracket, such that the latch 128 snap fits within the hole 216 to securely hold the block 106 within the bracket 210 and the fan gantry 100 within the server chassis 100 as shown in FIG. 7.

To remove the fan gantry 100, a user can pull up on the finger holds 126 of block 104 to remove latch 124 from within the hole 216 of bracket 210. The fan gantry 100 can then be lifted from the server chassis 200. Thus, the combination of the blocks 104 and 106, the brackets 208 and 210, and the center mount 212 can provide tool-less installation, retention, and removal of the fan gantry 100. In an embodiment, the brackets 208 and 210, and the center mount 212 can vary depending on the server chassis to allow different mounting variations for the fan gantry 100. One of ordinary skill in the art would recognize that side-to-side and front-to-back described herein are general terms used for convenience and easy of understanding with respect to the figures, but these terms of direction can be switched without varying from the scope of the disclosure.

Figure 8:
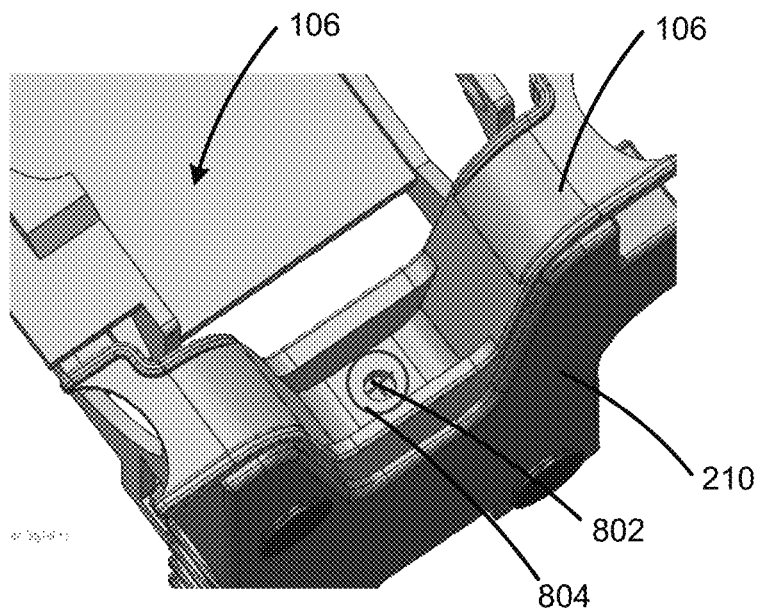
FIG. 8 is a perspective view of the fan gantry with a secure mount to the server chassis according to at least one embodiment of the present disclosure.

FIG. 8 illustrates an embodiment of the fan gantry 100 including a hole 802 utilized to hard mount the fan gantry 100 to the server chassis. In this embodiment, after the fan gantry 100 is completed inserted within the server chassis, a screw 804 can be inserted within the hole 802 of the block 106 to hard mount the block 106 to the bracket 210 of the server chassis. A user can tighten the screw 804 until the fan gantry 100 is firmly hard mounted to the server chassis.

Figure 9:
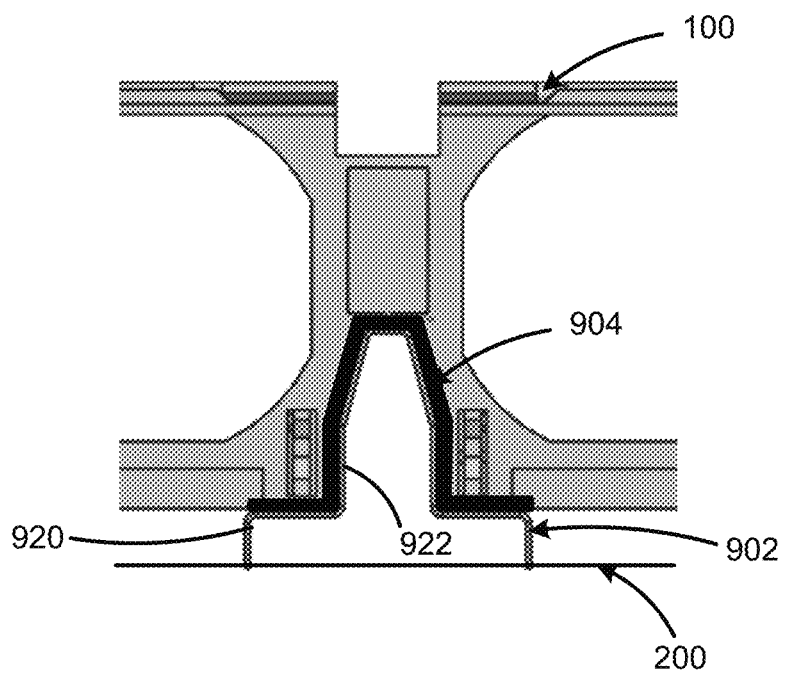
FIGS. 9-11 are views of the fan gantry isolated from the server chassis according to at least one embodiment of the present disclosure.
Figure 10:
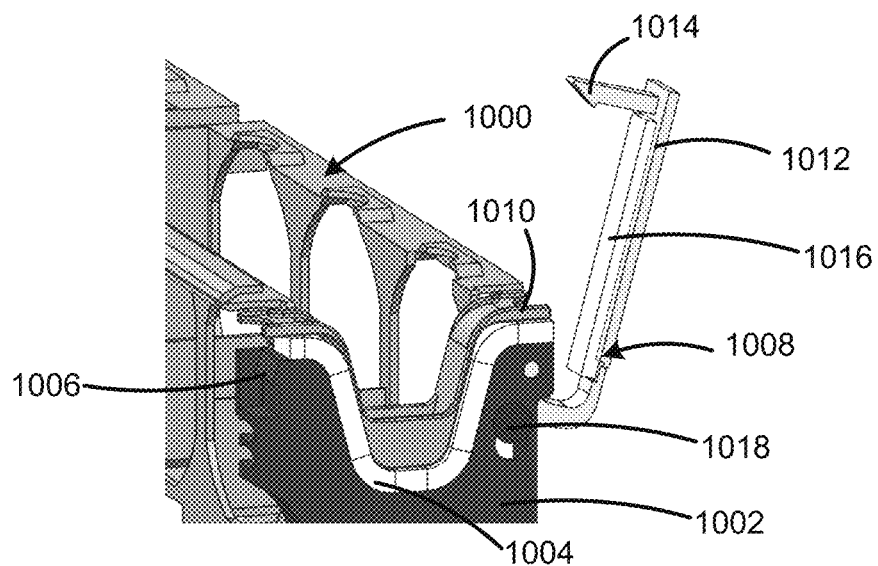
Figure 11:
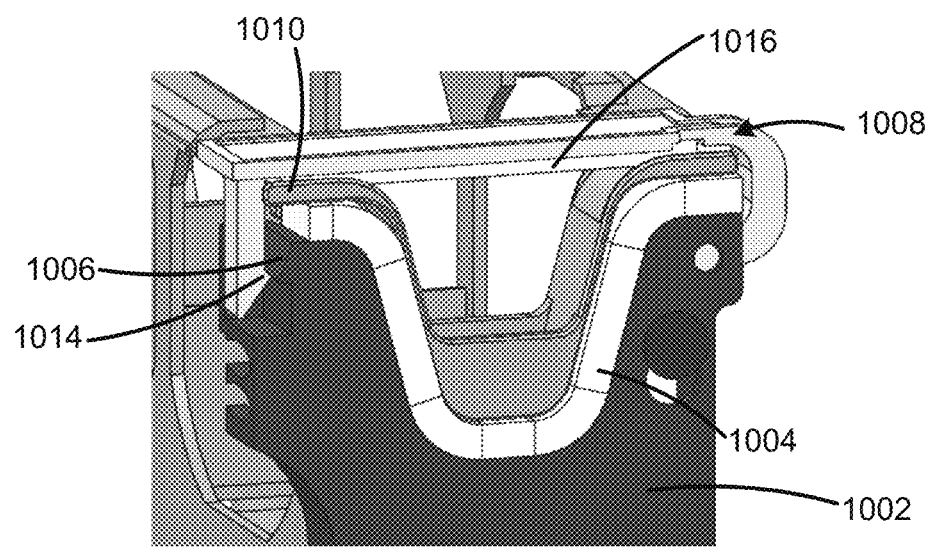

FIGS. 9-11 illustrate an embodiment with the fan gantry 100 isolated from the server chassis 200. Referring now to FIG. 9, the server chassis 200 includes a center mount 902 with an isolation lining 904 that can cover a top of the main portion 920 and the protruding portion 922. The isolation lining 902 can be foam or a similar damping/isolation material. In an embodiment, the isolation lining 904 can dampen vibrations generated by the fans with the fan gantry 100, such that any components within in the server chassis 200 that are sensitive to vibrations can be isolated from the vibrations of the fans. In this embodiment, the center mount 902 can smaller than the center mount 212 discussed in FIGS. 2-7, such that the same fan gantry 100 can interface with the center mount 902 with the isolation lining 904 as with the center mount 212.

FIGS. 10 and 11 show a bracket 1002, similar to the bracket 210 of FIGS. 2-7, that includes an isolation lining 1004, a hook 1006, and latch 1008. A fan gantry 1000 includes a block 1010 that are substantially similar to the fan gantry 100 and block 106 in FIG. 1-7. The latch 1008 includes a handle 1012, a clasp 1014, an isolation lining 1016, and is connected to the bracket 1002 via a pin 1018. An opening of the bracket 1002 can be larger than an opening of bracket 210, such that the same fan gantry can interface with the bracket 1002 having the isolation lining 1004 as with the bracket 210 not having the isolation lining 1004.

Upon the block 106 being inserted within the bracket 1002 and placed in physical communication with the isolation lining 1004, the latch 1008 can be rotated around pin 1018 until the clasp 1014 snap fits over the hook 1006 as shown in FIG. 11. In this situation, the block 106 is in physical communication with isolation linings 1004 and 1016, and a gap can exist between the block 106 and the other portions of the bracket 1002, and between the block 106 and the other portions of the latch 1008. Therefore, vibrations from the fans of the fan gantry are isolated from the bracket 1002 via the isolation linings 1004 and 1016. One of ordinary skill in the art will recognize that while the description is only being made with respect to a single bracket having an isolation lining, the server chassis can include more than one bracket similarly designed to complete the isolation of the fan gantry 1000 to the server chassis. In another embodiment, the bracket 1002 can include a spacer portion that includes the isolation lining 1004 without the latch 1008. In this embodiment, the block 1010 of the fan gantry 1000 can be inserted within the bracket 1002 and be placed in physical communication with the isolation lining 1004.

Figure 12:
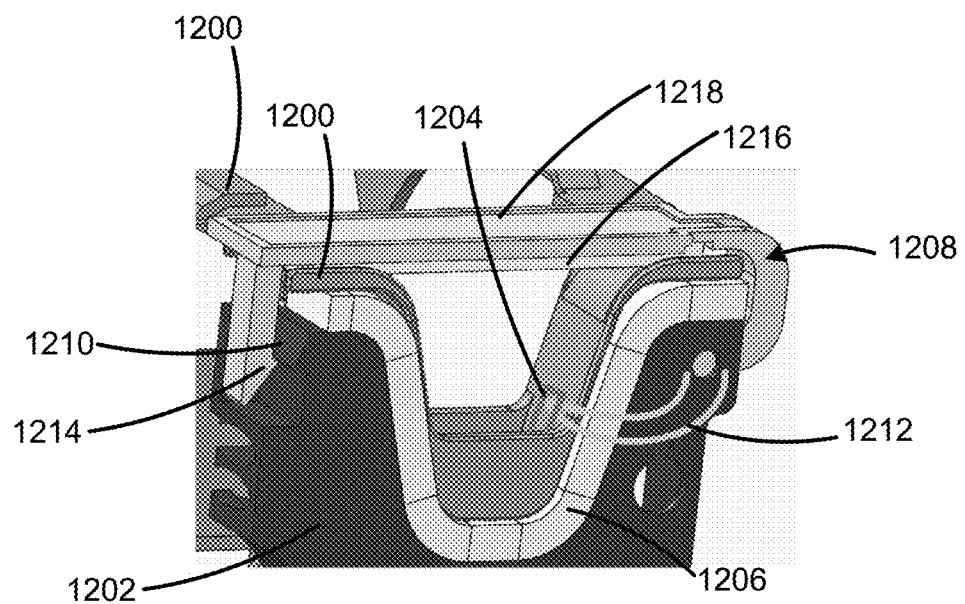
FIG. 12 is a perspective view of the fan gantry and the server chassis with a post according to at least one embodiment of the present disclosure.

FIG. 12 illustrates a block 1200 of a fan gantry 1202, and a bracket 1202 of a server chassis according to at least one embodiment of the present disclosure. The block 1200 includes an opening 1204. The bracket 1202 includes an isolation lining 1206, a latch 1208, and a hook 1210. The isolation lining 1206 and hook 1208 are substantially similar to the isolation lining 1004 and hook 1006 described above with respect to FIGS. 10 and 11. The latch 1008 includes a post 1212, a clasp 1214 similar to clasp 1014 of FIGS. 10 and 11, an isolation lining 1216 similar to isolation lining 1016 of FIGS. 10 and 11, and a handle 1218 similar to handle 1012 of FIGS. 10 and 11. In an embodiment, the post 1212 can interface with the opening 1204, such that as the latch 1208 is rotated to an open position the post 1212 can rotate as well and can apply a force to the block 1200 via the opening 1204 to unseat the fan gantry 1202 from the server chassis. When the latch 1208 is closed over the block 1200, such that the block 1200 is isolated between isolation linings 1206 and 1216, the latch 1208 can pull the post down and away from the opening 1204 to enable the block to be seated within the bracket 1202.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a processor or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
    a server chassis having a first bracket secured to a first edge of the server chassis, a second bracket secured to a second edge of the server chassis, and a center mount secured to a bottom of the server chassis;
    a fan gantry having a plurality of fans, a first block secured to a first end of the fan gantry, a second block secured to a second end of the fan gantry, and an opening in a center of a bottom surface of the fan gantry, wherein the first block interfaces with the first bracket, the second block interfaces with the second bracket, and the center mount inserts within the opening to mount the fan gantry to the server chassis;
    a first isolation lining on the first bracket, wherein the first isolation lining is located in between the first block and the first bracket when the first block is inserted within the first bracket to reduce vibration in the server chassis from the fan gantry; and
    a second isolation lining on the second bracket, wherein the second isolation lining is located in between the second block and the second bracket when the second block is inserted within the second bracket to reduce vibration in the server chassis from the fan gantry.

2. The information handling system of claim 1, wherein the first and second brackets and the first and second blocks are wedge-shaped.

3. The information handling system of claim 2, wherein front-to-back alignment of the fan gantry in between a front and a back of the server chassis is performed as the first block is inserted into the first bracket.

4. The information handling system of claim 1, wherein the center mount and the opening are wedge-shaped.

5. The information handling system of claim 4, wherein side-to-side alignment of the fan gantry in between the first edge and the second edge of the server chassis is performed as the center mount is inserted into the opening.

6. The information handling system of claim 1, wherein the first block is securely mounted to the first bracket via a screw.

7. The information handling system of claim 1, further comprising:
    a latch to snap fit over the first block to securely retain the fan gantry within the server chassis.

8. A fan gantry comprising:
    a plurality of fans;
    a first block secured to a first end of the fan gantry, the first block to interface with a first bracket of a server chassis, wherein a first isolation lining is located in between the first block and the first bracket when the first block is inserted within the first bracket to reduce vibration in the server chassis from the fan gantry;
    a second block secured to a second end of the fan gantry, the second block to interface with a second bracket of the server chassis, wherein a second isolation lining is located in between the second block and the second bracket when the second block is inserted within the second bracket to reduce vibration in the server chassis from the fan gantry; and
    an opening in a center of a bottom surface of the fan gantry, the opening to receive a center mount of the server chassis to mount the fan gantry to the server chassis.

9. The fan gantry of claim 8, wherein the first and second blocks are wedge-shaped.

10. The fan gantry of claim 9, wherein front to back alignment of the fan gantry within the server chassis is performed as the first block is inserted into the first bracket.

11. The fan gantry of claim 8, wherein the opening is wedge-shaped.

12. The fan gantry of claim 11, wherein side-to-side alignment of the fan gantry in between the first edge and the second edge of the server chassis is performed as the center mount is inserted into the opening.

13. An information handling system comprising:
    a server chassis including:
        a bracket secured to a first edge of the server chassis;
        a first isolation lining on the bracket;
        a latch including a second isolation lining, a clasp, and a hook; and
        a center mount secured to a bottom of the server chassis;
    a fan gantry including:
        a plurality of fans;
        an opening in a center of a bottom surface of the fan gantry, wherein the center mount inserts within the opening to mount the fan gantry to the server chassis; and
        a block secured to a first end of the fan gantry, the block interfacing with the bracket, the clasp of the latch snap fitting over the hook to securely hold the first block between the first and second isolation linings and to retain the fan gantry within the server chassis; and
    an isolation lining on the bracket, wherein the isolation lining is located in between the block and the bracket when the block is inserted within the bracket to reduce vibration in the server chassis from the fan gantry.

14. The information handling system of claim 13, wherein latch further includes a post, the post to interface with the block and to unseat the block from the bracket in response to the latch being rotated to an open position.

15. The information handling system of claim 13, wherein the first and second isolation linings dampen vibrations generated by the fan gantry from the server chassis.

16. The information handling system of claim 13, wherein the bracket and the block are wedge-shaped.

17. The information handling system of claim 16, wherein front-to-back alignment of the fan gantry in between a front and a back of the server chassis is performed as the block is inserted into the bracket.

18. The information handling system of claim 13, wherein the center mount and the opening are wedge-shaped.

19. The information handling system of claim 18, wherein side-to-side alignment of the fan gantry in between the first edge and the second edge of the server chassis is performed as the center mount is inserted into the opening.

* * * * *